United States Patent [19]

Furlow

[11] Patent Number: 5,072,199
[45] Date of Patent: Dec. 10, 1991

[54] BROADBAND N-WAY ACTIVE POWER SPLITTER

[75] Inventor: Robert J. Furlow, Kirkland, Wash.

[73] Assignee: The Boeing Company, Seattle, Wash.

[21] Appl. No.: 561,790

[22] Filed: Aug. 2, 1990

[51] Int. Cl.$^5$ .............................................. H03H 7/48
[52] U.S. Cl. .................................... 333/124; 328/105;
330/148; 330/277; 330/295
[58] Field of Search ................ 333/100, 124; 330/148,
330/277, 294, 295; 307/244; 328/105; 455/6,
132, 291

[56] References Cited

U.S. PATENT DOCUMENTS

| | | | |
|---|---|---|---|
| 2,611,895 | 9/1952 | Lacey | 455/6 |
| 3,030,584 | 4/1962 | Gabriel | 328/105 X |
| 3,135,926 | 6/1964 | Bockemuehl . | |
| 3,187,259 | 6/1965 | Scandurra et al. | 455/6 |
| 3,336,540 | 8/1967 | Kwartiroff et al. | 333/124 X |
| 3,710,260 | 1/1973 | Wright | 328/105 X |
| 3,801,933 | 4/1974 | Teare . | |
| 3,835,406 | 9/1974 | Thompson . | |
| 4,284,959 | 8/1981 | Heagerty et al. | 330/253 |
| 4,378,537 | 3/1983 | Scandurra | 333/100 |
| 4,500,848 | 2/1985 | Marchand et al. | 330/285 |
| 4,595,881 | 6/1986 | Kennan | 330/54 |
| 4,631,490 | 12/1986 | Takahashi | 330/295 X |
| 4,668,920 | 5/1987 | Jones | 330/286 |
| 4,769,618 | 9/1988 | Parish et al. | 330/277 |
| 4,775,842 | 10/1988 | Rumreich | 330/148 X |

FOREIGN PATENT DOCUMENTS

| | | | |
|---|---|---|---|
| 2342581 | of 0000 | France . | |
| 55-50751 | of 0000 | Japan . | |
| 58-162108 | of 0000 | Japan . | |
| 59-174007 | of 0000 | Japan . | |
| 5103 | 1/1989 | Japan | 333/100 |
| 2151864 | of 0000 | United Kingdom . | |

OTHER PUBLICATIONS

Ruthroff, C. L., "Some Broad-Band Transformers," *Proceedings of the IRE*, 1959, pp. 1337-1342.
Wilkinson, E. J., "An N-Way Hybrid Power Divider," *IRE Transactions on Microwave Theory and Techniques*, 1960, pp. 116-118.
Watson, J., "Biasing Considerations in F.E.T. Amplifier Stages," *Electronic Engineering*, 1968, pp. 600-605.
Danilovic, D. Z., et al., "Voltage Stabilization of the Source-Follower Operating Point," *Electronic Engineering*, 1969, pp. 221-223.
Niclas, K. B., et al., "The Matched Feedback Amplifier: Ultrawide-Band Microwave Amplification with GaAs MESFET's," *IEEE Transactions on Microwave Theory and Techniques*, vol. MTT-28, No. 4, Apr. 1980, pp. 285-294.
Barta, G. S., et al., "Surface-Mounted GaAs Active Splitter and Attenuator MMIC's Used in a 1-10-GHz Leveling loop," *IEEE Transactions on Microwave Theory and Techniques*, vol. MTTT-34, No. 12, Dec. 1986, pp. 1569-1575.

*Primary Examiner*—Paul Gensler
*Attorney, Agent, or Firm*—Christensen, O'Connor, Johnson & Kindness

[57] ABSTRACT

A power splitter (10), including a feedback amplifier (16) and matching network (18), is disclosed for splitting the output of a signal source (12) to be applied to a processing system (14). The feedback amplifier includes a gain stage (20) and active load (22). The gain stage includes a field-effect transistor (FET) (Q1) and feedback components (LF and RF) that provide the amplification required to give the power splitter unity gain. An inductive element (LD) gives the amplifier the desired bandwidth and a dual-gate FET (Q2) is employed as the active load to reduce loading of the gain stage. The matching network includes a plurality of stages (e.g., 24), each of which includes a source follower FET (e.g., Q3) and a single-gate active load FET (e.g., Q4). The resultant power splitter provides the desired equal power, matched phase outputs with suitable isolation and minimal insertion losses.

11 Claims, 1 Drawing Sheet

BROADBAND N-WAY ACTIVE POWER SPLITTER

FIELD OF THE INVENTION

This invention relates generally to power splitters and, more particularly, to active power splitters.

BACKGROUND OF THE INVENTION

There are many applications in which it is desirable to split a signal for use by more than one portion of a system. For example, it is sometimes desirable to provide the same local oscillator (lo) frequency output to the receiver and transmitter of a communication system. Similarly, it may be desirable to provide the same output including information on a number of channels to different receivers tuned to different channels.

In such applications, it is generally desirable for each of the outputs produced by the power splitter to exhibit a matched phase and equal power. In addition, the voltage standing wave ratio (VSWR) at any port of the splitter should be relatively low when all other ports are properly terminated. Further, the power splitter should generally have a low insertion loss and should also provide isolation between all output ports and provide reverse isolation between the input and output ports. These properties should further be achievable over a broad bandwidth without loss of gain.

Several techniques have been used to provide the desired signal division and phase matching. The first such approach to be discussed is often referred to as a "lumped" approach because it relies upon the use of discrete components. For example, a lumped system may employ transformers formed by multifilar wire wound through cylindrical ferrite cores. The input signal to be divided is then applied across the primary winding of the transformer and the outputs are tapped off the secondary windings.

The lumped approach is typically limited to VHF and UHF applications, because of the interline capacitances involved. Further, the construction of such transformers is labor intensive. In addition, traditional lumped approaches sometimes offer limited phase match if transformer symmetry is not maintained.

Another conventional approach used to achieve power splitting is known as the "distributed" approach. In this configuration, the components relied upon to perform the desired signal division and phase matching are effectively distributed throughout a section of transmission line. More particularly, the input signal is applied to one end of a plurality of quarter-wavelength transmission elements that act as distributed transformers. The other ends of the transmission elements terminate, for example, in impedances to provide the desired outputs.

Because the distributed approach relies upon one-quarter-wavelength elements to, in part, achieve the desired phase matching, the components used are typically relatively large (at the frequency of interest) and restricted to an octave bandwidth. This approach does, however, absorb output load mismatch. Also, because the losses are limited to the line losses, the distributed approach exhibits relatively low insertion losses.

A third approach to power splitting is known as the "active" approach. This technique employs at least some active components and may be implemented using elements of the distributed approach. An example of such a configuration is disclosed in U.S. Pat. No. 4,769,618 (Parish et al.), where field-effect transistors are employed to provide gain between distributed points in an input transmission line and distributed points in a plurality of output lines. Although active approaches typically have a relatively broad bandwidth, they use a large number of gain stages and require cascading to produce more than two outputs.

As will be appreciated from the preceding remarks, it would be desirable to produce a relatively simple power splitter that provides equal power, matched phase outputs to a large number of ports, while having a low insertion loss and providing the isolation required between all ports.

SUMMARY OF THE INVENTION

In accordance with this invention, an active power splitter is disclosed for receiving an input signal and producing a plurality of output signals having matched phases and equal power. The power splitter includes a broadband feedback amplifier for amplifying the input signal to produce an amplified signal. An active matching network is included for splitting the amplified signal into the plurality of output signals.

In a preferred arrangement, the power splitter includes a gain stage field-effect transistor having a gate terminal, a drain terminal, and a source terminal. An input inductive element is coupled to the gate terminal of the gain stage field-effect transistor. Similarly, an output inductive element is coupled to the drain terminal of the gain stage field-effect transistor and a feedback loop, including an inductive feedback element and a resistive feedback element, is coupled between the gate terminal of the gain stage field-effect transistor and the output inductive element.

A dual-gate field-effect transistor having two gate terminals, a drain terminal, and a source terminal is also included. The two gate terminals and the source terminal of the dual-gate field-effect transistor are coupled to the output inductive element and the feedback loop at a common point or node.

The power splitter also includes a first source follower field-effect transistor having a gate terminal, a drain terminal, and a source terminal. The gate terminal of the first source follower field-effect transistor is coupled to the common point. A first load field-effect transistor is also included, having a gate terminal, a drain terminal, and a source terminal. The gate and source terminals of the first load field-effect transistor are coupled together and the drain terminal of the first load field-effect transistor is coupled to the source terminal of the first source follower field-effect transistor.

Similarly, a second source follower field-effect transistor having a gate terminal, a drain terminal, and a source terminal is disclosed. The gate terminal of the second source follower field-effect transistor is coupled to the common point. Also, a second load field-effect transistor having a gate terminal, a source terminal, and a drain terminal is included. The gate and source terminals of the second load field-effect transistor are coupled together and the drain terminal of the second load field-effect transistor is coupled to the source terminal of the second source follower field-effect transistor.

BRIEF DESCRIPTION OF THE DRAWINGS

The invention will presently be described in greater detail, by way of example, with reference to the accompanying drawings, wherein.

DETAILED DESCRIPTION OF THE PREFERRED EMBODIMENT

Figure 1:
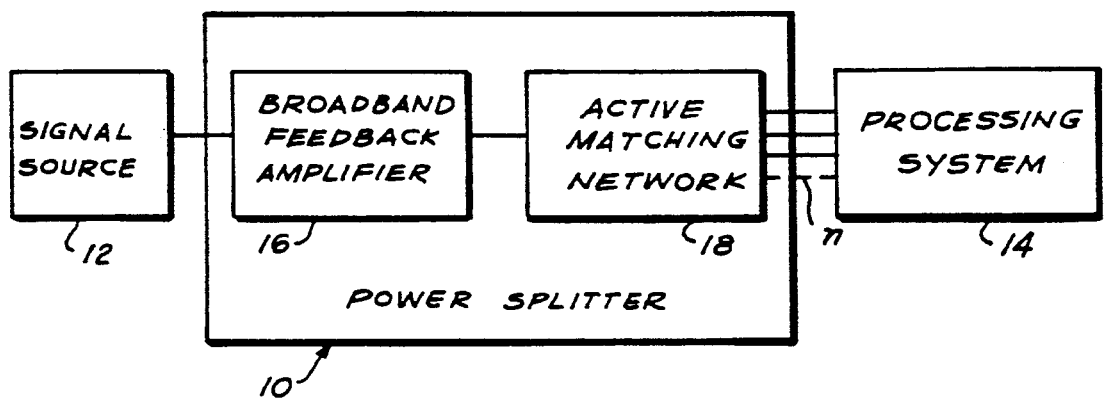
FIG. 1 is a block diagram illustrating a power splitter for splitting an input signal received from a signal source into a plurality of output signals, having equal power and matched phase, applied to a processing system.

Referring now to FIG. 1, a broadband, N-way power divider or power splitter 10 constructed in accordance with this invention is shown. As illustrated, power splitter 10 couples a signal source 12 to a processing system 14, splitting the input signal received from signal source 12 into a plurality of output signals having equal power and matched phase.

Addressing these components individually, the signal source 12 produces a radio frequency (RF) input signal that may have any one of a wide variety of input frequencies. Signal source 12 may be any one of a variety of devices or systems, such as a local oscillator or a remote RF transmitter. The processing system 14, on the other hand, receives the equal amplitude, matched phase RF outputs from power splitter 10. Processing system 14 may be, for example, a transmitter and receiver that receive local oscillator signals or a multi-channel receiver for receiving signals that include a plurality of channels of information.

Addressing now the details of power splitter 10, as shown in FIG. 1, it includes a broadband feedback amplifier 16 and an active matching network 18. Cooperatively, these components split the input signal into the desired number n of equal power, matched phase, and isolated output signals, while isolating the signal source 12 and processing system 14 and minimizing the insertion losses therebetween.

The feedback amplifier 16 provides the gain and gain slope compensation required to allow the power splitter 10 to exhibit near-unity gain. Amplifier 16 also provides isolation between the signal source 12 and the active matching network 18, allowing the matching network 18 to be designed to produce additional outputs without loading the signal source 12.

As will be described in greater detail below, the active matching network 18 includes a plurality of stages that are designed to ensure that each of the output signals exhibits an equal amplitude and phase match. The active matching network 18 further provides a good VSWR at the output ports of power splitter 10. The matching network 18 is also designed to provide a large number of output signals with a minimum of circuit complexity.

Figure 2:
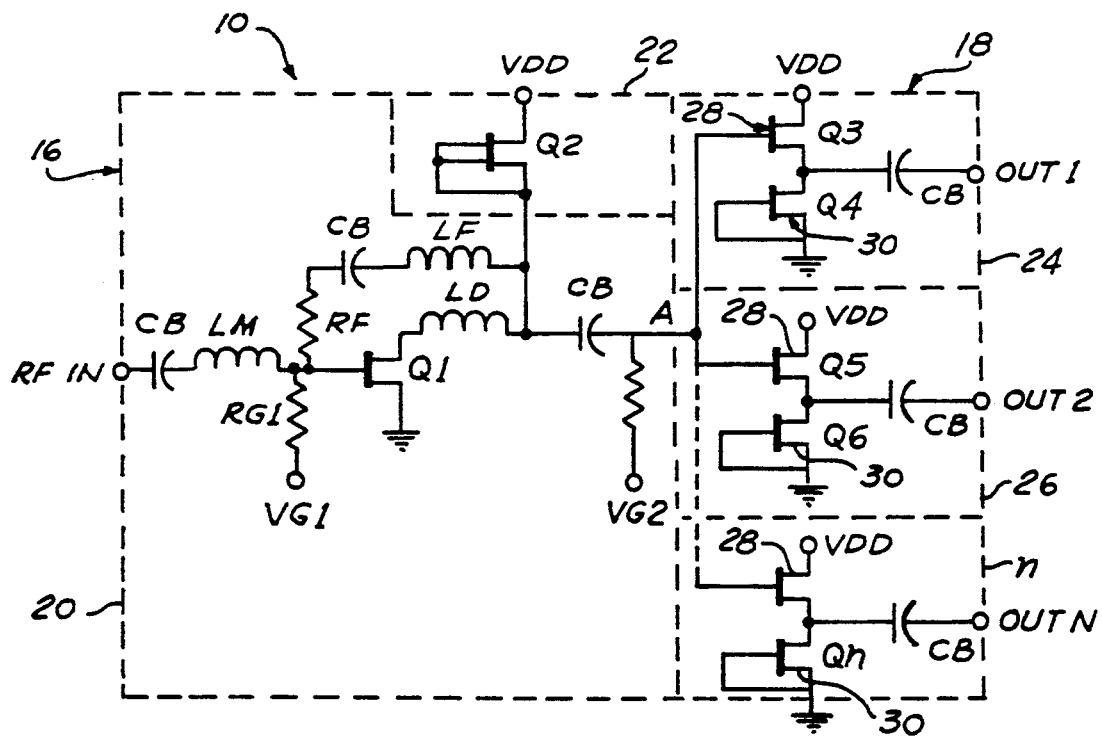
FIG. 2 is a more detailed schematic diagram of the power splitter of FIG. 1.

Addressing these components of power splitter 10 individually, as shown in greater detail in FIG. 2, the feedback amplifier 16 includes a gain stage 20 and active load 22. The gain stage 20 includes a field-effect transistor (FET) Q1 having gate, source, and drain terminals. The drain terminal of transistor Q1 is coupled to an output-summing node A by the series combination of a drain inductance LD and a DC-blocking capacitor CB. The gate terminal of transistor Q1 is coupled to the RF input from signal source 12 by the series combination of an inductor LM and blocking capacitor CB. The source terminal of transistor Q1 is coupled to ground.

The gain stage 20 also includes a feedback loop formed by the series combination of a feedback resistor RF, a blocking capacitor CB, and a feedback inductor LF. This series of components is coupled between the gate of transistor Q1 and the junction of the drain inductor LD and the blocking capacitor CB. A bias voltage $V_{g1}$ is applied to the gate of transistor Q1 through a bias resistor RG1.

Addressing the functions of these various components, as will be appreciated, the blocking capacitors CB are included to block the flow of DC signal component between sections of the gain stage 20. The inductor LM is, in turn, included to improve the input VSWR. The inductive and resistive feedback components LF and RF provide the feedback required by transistor Q1 to give stage 20 the desired relatively flat gain characteristics.

With respect to the inductor LD, conventional negative feedback amplifiers exhibit a tradeoff between flat gain and bandwidth. The inductive component LD is added to increase the bandwidth of the feedback amplifier by increasing the high-frequency band edge. More particularly, the inductive component LD creates positive feedback near the upper band edge by compensating for the capacitive component of the FET output impedance. At the same time, the output match is improved. The inductor LD also controls the gain slope compensation.

As shown in FIG. 2, the active load 22 of feedback amplifier 16 includes a dual-gate FET Q2. The two gate terminals of transistor Q2, as well as the source terminal, are connected to the junction of the inductive elements LF and LD. The drain terminal of transistor Q2 is coupled to a bias supply $V_{dd}$.

Transistor Q2 operates as an FET constant-current source when the voltage $V_{ds}$ between its drain and source terminals is above the pinchoff voltage of transistor Q2. In this mode of operation, transistor Q2 provides an active load for the gain stage transistor Q1. As an illustration, assume that the total gate width of transistor Q2 is one-half as wide as the total gate width of transistor Q1 and that the current flowing between the drain and source terminals of transistor Q2 is equal to the maximum drain current $I_{dss}$ of transistor Q2. Because $I_{dss}$ is proportional to device width and because transistor Q2 is acting as a current source for transistor Q1, transistor Q1 is operating at one-half the maximum drain current $I_{dss}$ of transistor Q2.

Although transistor Q2 could be a single-gate FET, in a high-gain MMIC, HEMT, or pseudomorphic HEMT application, such a single-gate construction creates a problem. In that regard, the drain-to-source resistance RDS of a single-gate transistor may be on the order of several hundred ohms. When used as an active load, this drain resistance RDS of transistor Q2 is sufficiently low to effectively shunt the current source formed by transistor Q2. With this shunted current source applied to the drain of transistor Q1, the overall gain of feedback amplifier 16 is degraded.

On the other hand, the dual-gate transistor Q2, shown in FIG. 2, is the equivalent of a cascode configuration of two single-gate FETs (i.e., a configuration in which the source terminal of a first FET is coupled to the drain terminal of a second FET, and the gate terminals of the two FETs are coupled to the source terminal of the second FET). The equivalent drain resistance RDS' of the pair is equal to the product of the FET transconductance gm and the square of the drain resistance RDS of one of the FETs. As a result, the equivalent drain resistance RDS' is increased to several thousand ohms. Because this shunt resistance is relatively high, it has little effect on the operation of Q2 as a current source and, as a result, the loading of the gain stage transistor Q1 is significantly reduced.

Addressing now the details of the matching network 18, as shown in FIG. 2, it includes a plurality of stages 24, 26, ..., and n. Stage 24, for example, includes a source follower 28 and active load 30 pair, formed by an FET Q3, FET Q4, and blocking capacitor CB. More particularly, the gate terminal of transistor Q3 is coupled to the summing node A at the output of amplifier 16. The drain terminal of transistor Q3 is, in turn, coupled to a bias supply $V_{dd}$ and the source terminal is coupled to an output terminal OUT 1 of stage 24 by the blocking capacitor CB. The drain terminal of transistor Q4 is coupled to the source of transistor Q3 and, hence, to output terminal OUT1 by blocking capacitor CB. The gate and source terminals of transistor Q4, on the other hand, are grounded.

Because the source follower 28 has a high input impedance, a relatively large number of output stages can be added to the power splitter 10 without intolerably loading the feedback amplifier 16. The output impedance of the source follower 28 is determined by the width of the gate and should be selected to ensure that the output ports are presented a good VSWR. The active load 30 provided by transistor Q4 operates as a current source to perform the same functions as transistor Q2 of amplifier 16, except that a single-gate FET is used.

The second stage 26 of matching network 18 also includes a source follower 28, and active load 30, formed by FET Q5, FET Q6, and blocking capacitor CB. As will be appreciated, the construction and operation of this stage 26 parallels that of stage 24. As represented by the broken line in FIG. 2, the same structure is included in each of the n stages employed in the matching network 18.

A key to obtaining equal amplitude and phase match at each of the outputs (OUT1, OUT2,..., OUTN) is to place all of the output stages (24, 26, ..., n) physically close to each other, for example, as part of an integrated circuit. As a result, each of the FETs in network 18 will have virtually identical electrical characteristics. Also, the physical line lengths between summing node A and each output (OUT1, OUT2, ..., OUTN) should be roughly equal, ensuring that the phase shift experienced at each output will be roughly the same.

As will be appreciated, in some applications it might be desirable to construct the matching network 18 to, instead, produce a plurality of outputs having controlled phase differences or different amplitude levels. For example, the power splitter 10 may be called upon to provide a plurality of local oscillator signals, having different phases, to the processing system 14. The desired variations in the outputs can be achieved in many ways including, for example, altering the layout and length of the components of the various stages and terminating the outputs in nonequal impedances.

Summarizing the operation of the feedback amplifier 16 and matching network 18 shown in FIG. 2, an RF input signal from signal source 12 is applied to the input RFIN of amplifier 16. The gain stage transistor Q1 and feedback components RF and LF provide the desired amplification of the input signal and make it available at the summing node A. Transistor Q2 provides the desired reduced active load for the gain stage transistor Q1, while inductor LM ensures the desired input VSWR and inductor LD ensures the desired gain-bandwidth characteristics.

The amplified input signal received at summing node A is applied to the gate terminals of the identical source follower FETs of the various output stages. As a result, the outputs (OUT1, OUT2, ..., OUTN) of the source follower FETs are all of equal amplitude and phase, and proportional to the RF input from signal source 12. As noted above, the active load FETs provide the desired loading of the source follower FETs and the high input impedance of the source followers allows a large number of output stages to be employed without unduly loading amplifier 16.

A power splitter 10 constructed in this manner divides the input from signal source 12 into a plurality of equal amplitude, matched phase outputs for application to processing system 14. The power splitter 10 provides unity gain, good isolation, and minimal insertion losses. It is also operable over a decade frequency band.

Those skilled in the art will recognize that the embodiments of the invention disclosed herein are exemplary in nature and that various changes can be made therein without departing from the scope and the spirit of the invention. In this regard, and as was previously mentioned, the invention can be embodied with any number of stages in the matching network 18. In addition, feedback amplifier stages can be cascaded to provide significant gain through the power splitter 10. Because of the above and numerous other variations and modifications that will occur to those skilled in the art, the following claims should not be limited to the embodiments illustrated and discussed herein.

The embodiments of the invention in which an exclusive property or privilege is claimed are defined as follows:

1. An active power splitter for receiving an input signal and producing a plurality of output signals, the output signals having matched phases and equal power, said power splitter comprising:
   broadband feedback amplifier means for amplifying the input signal to produce an amplified signal; and
   active matching network means for splitting the amplified signal into the plurality of output signals, said amplifier means comprising a gain stage and an active load, coupled to said network means and isolating said network means from the input signal.

2. An active power splitter for receiving an input signal and producing a plurality of output signals, the output signals having matched phases and equal power, said power splitter comprising:
   broadband feedback amplifier means for amplifying the input signal to produce an amplified signal; and
   active matching network means for splitting the amplified signal into the plurality of output signals, said amplifier means isolating said network means from the input signal and comprising a gain stage and an active load stage, coupled to said network means, said gain stage comprising:
   a first field-effect transistor having a gate terminal for receiving the input signal, a drain terminal coupled to said network means, and a source terminal; and
   an inductive feedback element and resistive feedback element, coupled between the drain terminal and the gate terminal of said first field-effect transistor, said inductive feedback element and said resistive feedback element cooperatively selected to ensure the desired gain characteristics of said gain stage.

3. The power splitter of claim 2, wherein said gain stage further comprises an input inductive element coupled to the gate terminal of said first field-effect transistor for applying the input signal to the gate terminal of said first field-effect transistor and providing said gain stage with an enhanced input voltage standing wave ratio.

4. The power splitter of claim 2, wherein said gain stage further comprises an output inductive element coupled between the drain of said first field-effect transistor and said network means for enhancing the bandwidth of said gain stage.

5. An active power splitter for receiving an input signal and producing a plurality of output signals, the output signals having matched phases and equal power, said power splitter comprising:
  broadband feedback amplifier means for amplifying the input signal to produce an amplified signal; and
  active matching network means for splitting the amplified signal into the plurality of output signals, said amplifier means isolating said network means from the input signal and comprising a gain stage and an active load stage, coupled to said network means, said active load comprising a second field-effect transistor having two gate terminals and a source terminal coupled to the drain terminal of said first field-effect transistor, said second field-effect transistor providing a relatively small load.

6. An active power splitter for receiving an input signal and producing a plurality of output signals, the output signals having matched phases and equal power, said power splitter comprising:
  broadband feedback amplifier means for amplifying the input signal to produce an amplified signal; and
  active matching network means for splitting the amplified signal into the plurality of output signals, said amplifier means isolating said network means from the input signal, said network means comprising a plurality of pairs of source followers and active loads coupled to said amplifier means at a single point.

7. The power splitter of claim 6, wherein each said pair of source followers and active loads comprises:
  a source follower field-effect transistor having a drain terminal, a gate terminal coupled to said amplifier means, and a source terminal; and
  a load field-effect transistor having a drain terminal, coupled to the source terminal of said source follower field-effect transistor, and a gate terminal and a source terminal coupled together.

8. The power splitter of claim 7, wherein said source follower field-effect transistors and said load field-effect transistors are included as part of an integrated circuit and are physically close to each other.

9. A power splitter for receiving an input signal and producing a plurality of output signals comprising:

a gain stage field-effect transistor having a gate terminal, a drain terminal, and a source terminal;
  an input inductive element coupled to the gate terminal of said gain stage field-effect transistor;
  an output inductive element coupled to the drain terminal of said gain stage field-effect transistor;
  a feedback loop, including an inductive feedback element and a resistive feedback element, coupled between the gate terminal of said gain stage field-effect transistor and said output inductive element;
  a dual-gate field-effect transistor having two gate terminals, a drain terminal, and a source terminal, the two gate terminals and the source terminal of said dual gate field-effect transistor being coupled to the output inductive element and the feedback loop at a common point;
  a first source follower field-effect transistor having a gate terminal, a drain terminal, and a source terminal, the gate terminal of said first source follower field-effect transistor being coupled to said common point;
  a first load field-effect transistor having a gate terminal a drain terminal, and a source terminal, the gate and source terminals of said first load field-effect transistor being coupled together, the drain terminal of said first load field-effect transistor being coupled to the source terminal of said first source follower field-effect transistor;
  a second source follower field-effect transistor having a gate terminal, a drain terminal, and a source terminal, the gate terminal of said second source follower field-effect transistor being coupled to said common point; and
  a second load field-effect transistor having a gate terminal, a drain terminal, and a source terminal, the gate and source terminals of said second load field-effect transistor being coupled together, the drain terminal of said second load field-effect transistor being coupled to the source terminal of said second source follower field-effect transistor.

10. A method of splitting an input signal into a plurality of output signals comprising the steps of:
  applying the input signal to a broadband amplifier, coupled to an active load, to provide an amplified signal at a single node; and
  applying the amplified signal to a plurality of similar source followers, coupled to the single node, to provide the plurality of output signals.

11. A method of splitting an input signal into a plurality of output signals comprising the steps of:
  applying the input signal to a broadband amplifier, coupled to a dual-gate active load, to provide an amplified signal at a single node; and
  applying the amplified signal to a plurality of similar source followers, coupled to the single node, to provide the plurality of output signals.

* * * * *